United States Patent [19]

Huang

[11] Patent Number: 5,621,360
[45] Date of Patent: Apr. 15, 1997

[54] VOLTAGE SUPPLY ISOLATION BUFFER

[75] Inventor: Samson X. Huang, Cupertino, Calif.

[73] Assignee: Intel Corporation, Santa Clara, Calif.

[21] Appl. No.: 510,180

[22] Filed: Aug. 2, 1995

[51] Int. Cl.[6] ........................................ H03B 5/00
[52] U.S. Cl. ...................... 331/57; 331/116 FE; 331/175;
326/24; 326/83; 326/85; 326/34; 327/264;
327/278; 327/281; 327/391
[58] Field of Search ............................. 326/24, 26, 27,
326/28, 31, 33, 34, 83, 85; 327/141, 175,
262, 263, 264, 276, 285, 277, 278, 281,
389, 384, 391; 331/57, 116 FE, 175

[56] References Cited

U.S. PATENT DOCUMENTS 4,617,529  10/1986  Suzuki ............................ 331/57

5,175,445  12/1992  Kinugasa et al. .................. 326/34 X

*Primary Examiner*—Robert Pascal
*Assistant Examiner*—Arnold Kinkead
*Attorney, Agent, or Firm*—Blakely, Sokoloff, Taylor & Zafman

[57] ABSTRACT

A CMOS delay cell with feedback circuitry to ensure that the delay cell is operating in saturation mode. A voltage controlled oscillator (VCO) comprising a loop of an odd number of delay cells, where the VCO is operating in a saturation mode. Under normal operation any intermediate node in the VCO will generate an output signal from a delay cell with reduced supply noise. The output signal can be used to generate a PLL clock signal with a lower phase jitter than prior art VCO's operating at low supply potentials.

7 Claims, 4 Drawing Sheets

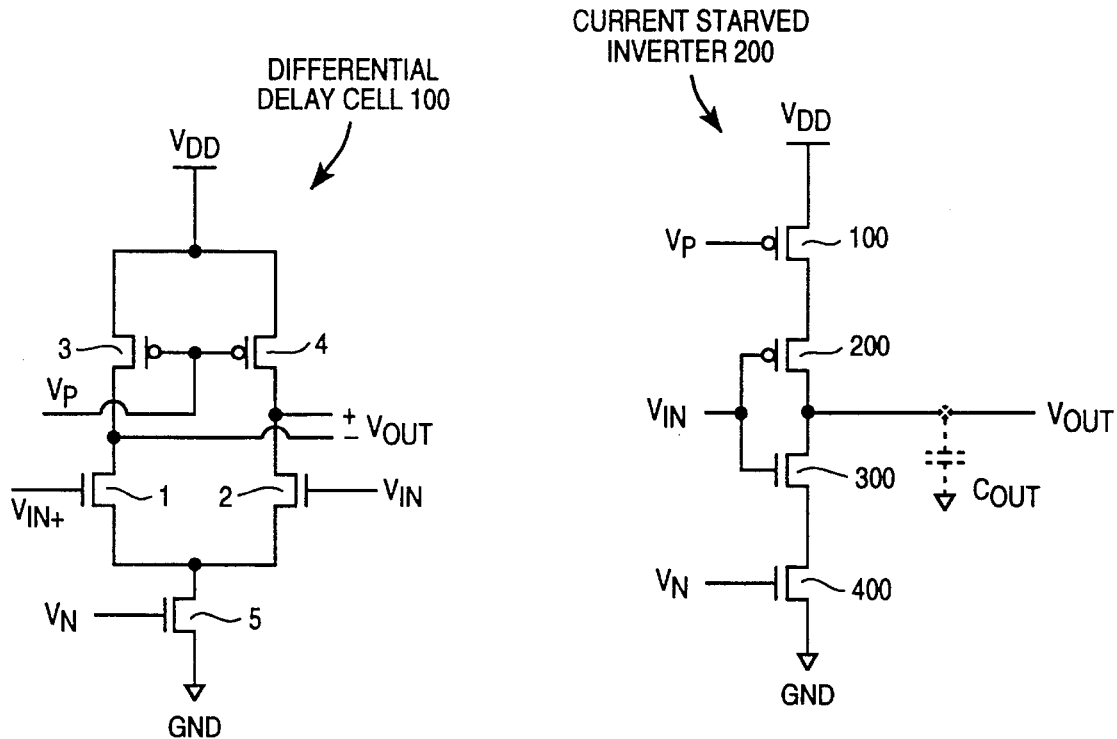
FIG_1
(PRIOR ART)
FIG_2
(PRIOR ART)
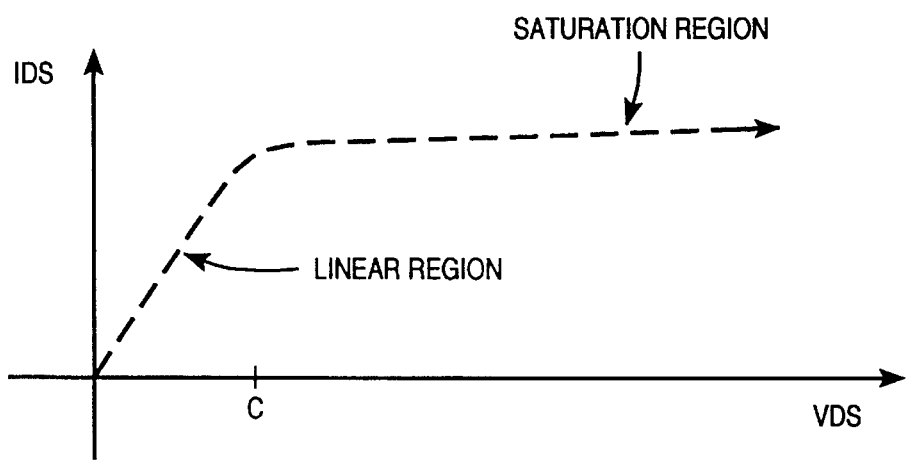
FIG_3

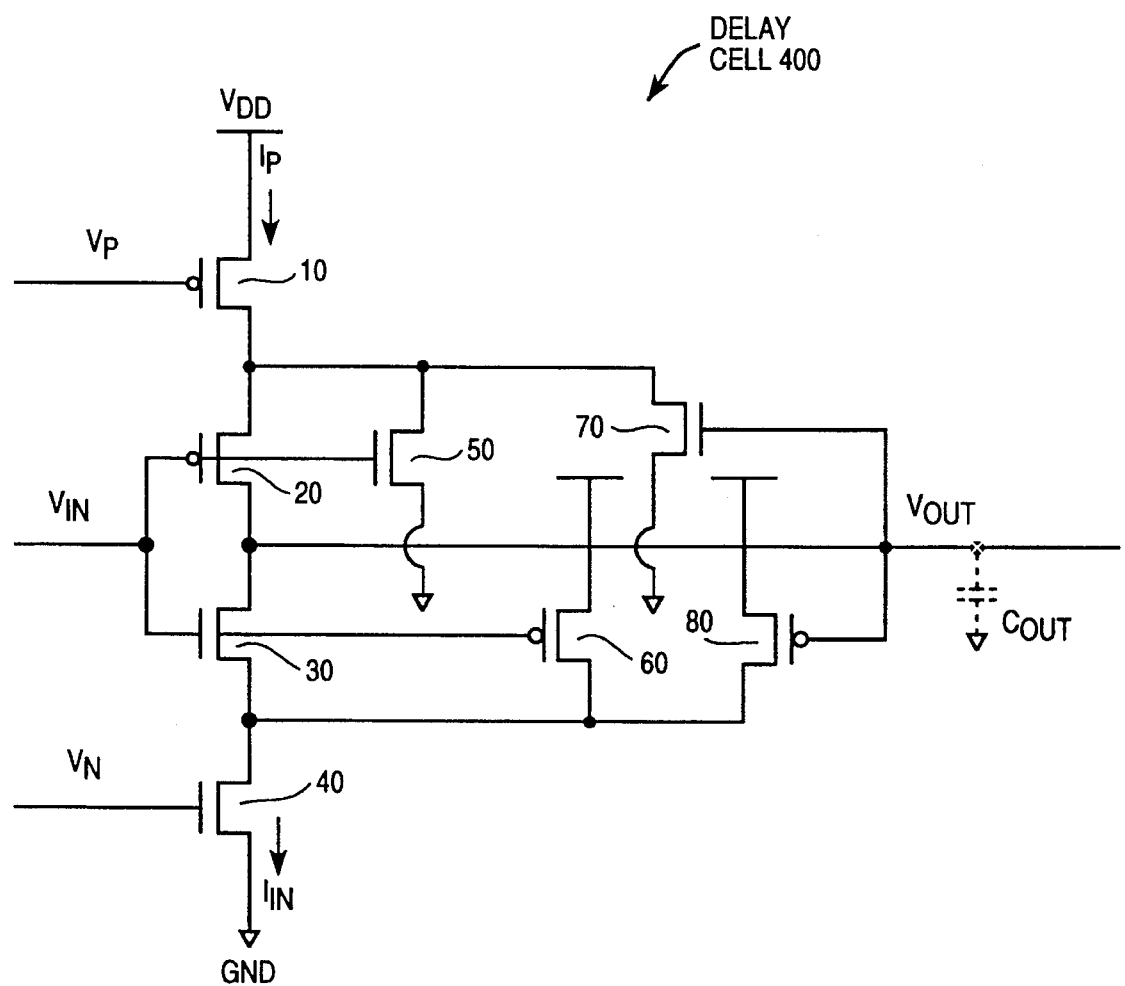
FIG_4

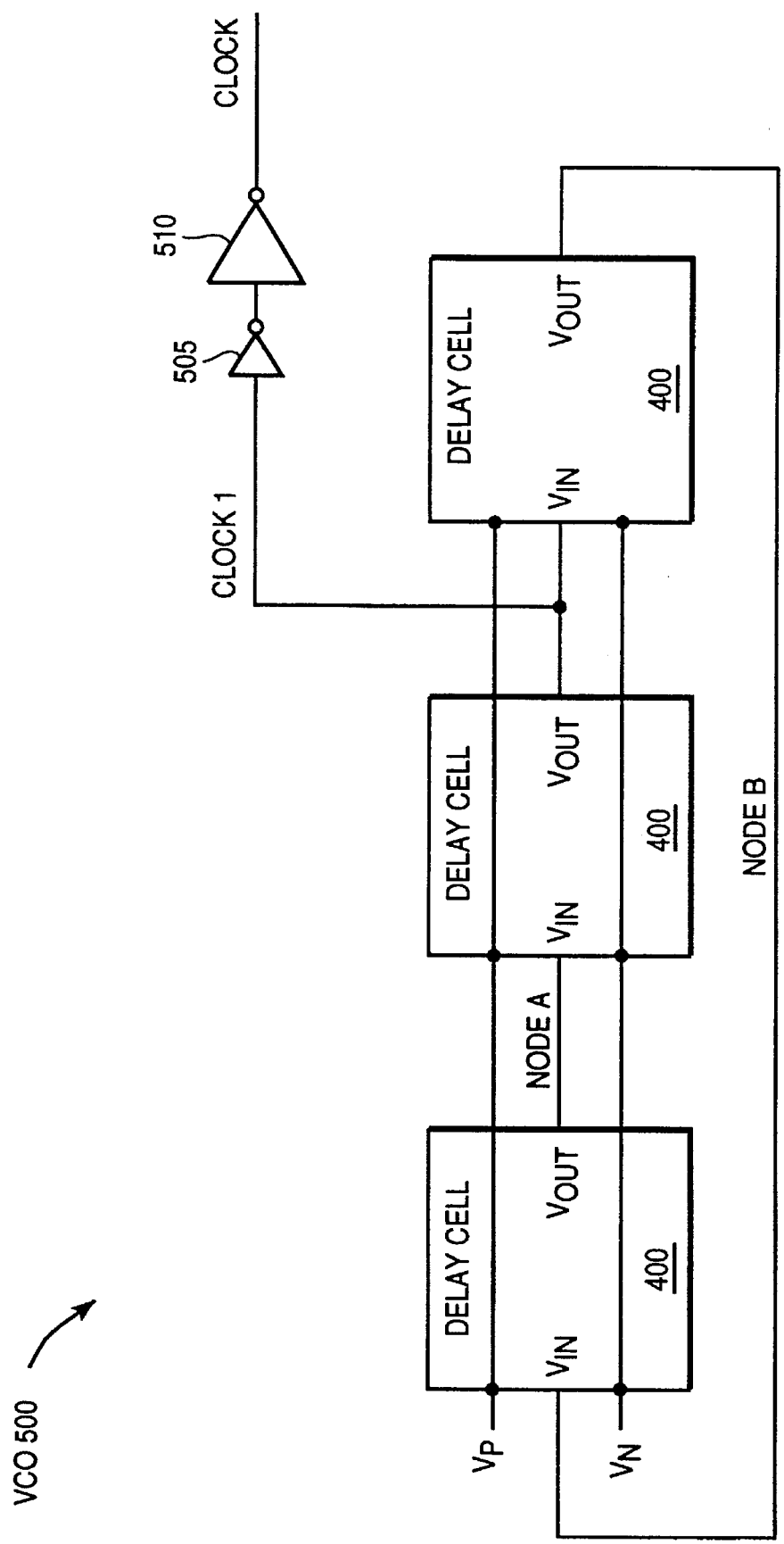
FIG_5

VOLTAGE SUPPLY ISOLATION BUFFER

FIELD OF THE INVENTION

The present invention generally relates to Voltage Controlled Oscillators and more particularly to an improved delay element for use in a Voltage Controlled Oscillator.

BACKGROUND OF THE INVENTION

Voltage Controlled Oscillators (VCO) are often used in Phase Lock Loop (PLL) circuits to generate clock signals. A Voltage controlled oscillator (VCO) is typically built by serially connecting a plurality of delay circuits in a loop and connecting to an intermediate node of the delay cell loop to generate a clock signal. This standard design is quite effective for integrated circuit systems with high supply potentials. The differential delay cell and the current starved inverter are examples of implementations used in present integrated circuits to generate clock signals because their inherent design limitation are not exposed in systems with high supply potential. As the speed and power consumption of integrated circuits is improved in next generation designs, present VCOs and their delay cells have great difficulty operating within the high clock speed and low supply potential specifications of the next generation designs.

FIG. 1 shows a delay cell according to the prior art. Differential Delay Cell 100 comprises two common source NMOS transistors 1 and 2 coupled between pull-down transistor 5 and pull-up transistors 3 and 4. Inputs Vp and Vn are used by the PLL to control the transition time of signals through the delay cell, while the Vin and Vout nodes are connected to subsequent delay cells to form the VCO loop. Differential Delay Cell 100 is often preferred for use in VCOs because the delay cell has a superior supply noise rejection and the cell can easily detect input/output voltage swings of subsequent cells. However, detection of input/output voltage swings is difficult to achieve at a low supply potential for Differential Delay Cell 100, thus making use of Differential Delay Cell 100 impractical for PLLs that support integrated circuits with low supply potentials.

Another prior art implementation of a delay cell is shown in FIG. 2. Current Starved Inverter 200 comprises a stacked gate design. PMOS transistor 200 has its source coupled to NMOS transistor 300, this coupled node is the output of the delay cell, while the gates of transistors 200 and 300 are coupled to the input of the delay cell, Vin. To control the pull-up and pull-down currents of Current Starved Inverter 200, PMOS transistor 100 is coupled between supply potential VDD and the drain of PMOS transistor 200 and NMOS transistor 400 is coupled between supply potential GND and the source of NMOS transistor 300. Similar to the design of Differential Delay Cell 100, the PLL can control the delay of signal propagation through Current Starved Inverter 200 by varying the input voltages Vp and Vn coupled to the gates of transistors 100 and 400. By varying the voltages Vp and Vn, the PLL can control the speed in which Current Starved Inverter 200 charges/discharges parasitic capacitance Cout. The CMOS design of the Current Starved Inverter 200 requires that PMOS transistor 100 and NMOS transistor 400 switch between the saturation and the linear region of operation during a transition of input Vin. During VCO operation Vin transitions continuously causing PMOS transistor 100 and NMOS transistor 400 to vary their current demand on the power supplies VDD and GND of Current Starved Inverter 200. The variations in current supply creates noise along the supply potential of the delay cell leading to signal degradation of the Vout node, especially at high frequencies.

The degradation of the Vout node results in phase jitter as the noisy Vout signal is propagated through subsequent delay cells in the VCO, leading to a noisy PLL clock signal which is unusable in integrated circuit design. Because the Current Starved Inverter delay cell designs lead to a noisy Vout signal in a low supply voltage system, it would be desirable to have an improved delay cell with good noise rejection that can operate at a low supply potential and reduce phase jitter.

SUMMARY OF THE PRESENT INVENTION

A CMOS circuit is described which reduces supply noise in a current starved voltage controlled delay cell. The circuit comprises a first circuit coupled between the input of the delay cell and the output of the delay cell. Where this first circuit is not connected to any supply potential but all supply nodes are connected to a positive supply rail or a negative supply rail. The positive supply rail is connected to VDD through a transistor, where the gate of this transistor is used to regulate the current through the first transistor. The negative supply rail is connected to ground through a second transistor, where the gate of the second transistor is used to regulate the current through the second transistor. A second circuit is coupled between the output of the delay cell, the input of the delay cell, and the positive supply rail of the first circuit. This second circuit is designed to ensure that the first transistor operates only in saturation mode. Finally a third circuit is coupled between the output of the delay cell, the input of the delay cell, and the negative supply rail of the first circuit. This third circuit is designed to ensure that the second transistor operates only in saturation mode. Ensuring that all transistors coupled to a power supply operate in the saturation region removes current spikes from the supply network of the delay cell, thus leading to a supply potential with reduced noise.

A Voltage Controlled Oscillator is also described which operates with reduced phase jitter in a low voltage supply system. The Voltage Controlled Oscillator comprises a plurality of current starved voltage controlled delay cells serially connected in a loop and operating primarily in the saturation region.

BRIEF DESCRIPTION OF THE DRAWINGS

The present invention is illustrated by way of example and not limitation in the figures of the accompanying drawing, in which like references indicate similar elements, and in which:

FIG. 1 is an illustration of a prior art implementation of a differential pair delay cell for use in a Voltage Controlled Oscillator FIG. 2 is an illustration of a prior art implementation of a logic delay cell for use in a Voltage Controlled Oscillator FIG. 3 is an illustration of a typical 1-V characteristic of a MOSFET device.

FIG. 4 is an illustration of a delay cell with reduced current spikes according to one embodiment of the present invention.

FIG. 5 is an illustration of a voltage controlled oscillator utilizing the circuit of FIG. 4 to generate a clock signal.

DETAILED DESCRIPTION

Figure 6:
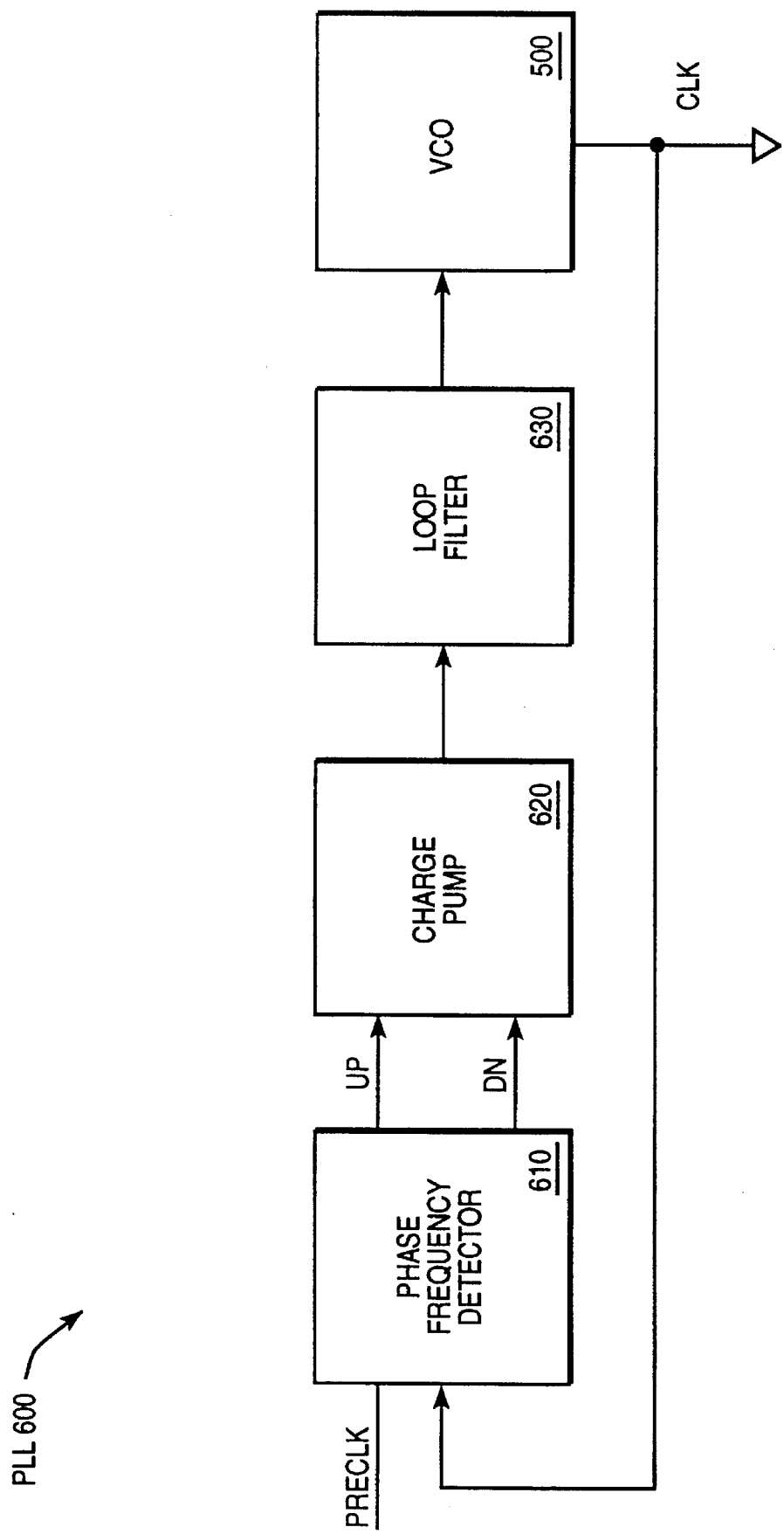
FIG. 6 is an illustration of a PLL using the circuit of FIG. 5 to generate a clock signal.

A CMOS circuit is described which prevents the operation of a current starved voltage controlled delay cell along the linear region. As shown by the I–V characteristic graph of FIG. 3, the saturation region is found when the source to drain potential of a MOS transistor (VDS) is larger than the gate to source voltage ($V_{gs}$) minus the threshold voltage ($V_t$), shown as constant C. The CMOS circuit ensures that the transistors connected to the supply potential have a voltage greater than C across their source drain; because these transistors will operate in the saturation region they will draw a constant current from the supply network of the delay cells. The constant current ensures no current spikes will occur in the supply network, thus reducing supply noise. In integrated circuits with low supply potentials, normally insignificant noise along the supply line appears magnified and can lead to signal delay or the incorrect translation of a logic level for a given signal. Both problems would lead to phase jitter in the operation of a voltage controlled oscillator, a design limitation overcome by the described circuit. Although the reduction of phase jitter is a concern of the described circuit, the transistors of the circuitry may also be sized to ensure that the operation of the delay cell does not lead to excessive power consumption.

While diagrams representing certain embodiments of the present invention are illustrated in FIGS. 4, 5 and 6 these illustrations are not intended to limit the invention. The specific circuits described herein are only meant to help clarify one's understanding of the present invention and to illustrate particular embodiments in which the present invention may be implemented. It will be appreciated that the broader spirit and scope of the present invention, as set forth in the appended claims, can be applied to any type of circuit which seeks the performance achievements attained by the present invention.

FIG. 4 shows a DELAY CELL 400 according to one embodiment. DELAY CELL 400 comprises an inverter structure with the source of PMOS transistor 20 coupled to the drain of NMOS transistor 30. The common node between PMOS transistor 20 and NMOS transistor 30 is the output of the delay cell and the transistors share a common gate input Vin. A PMOS transistor 10 has its source coupled to the drain of PMOS transistor 20 at a common first node. The gate of PMOS transistor 10, Vp, is controlled by the PLL, and the drain of PMOS transistor 10 is coupled to supply potential VDD. An NMOS transistor 40 has its drain coupled to the source of NMOS transistor 30 at a common second node. The gate of transistor 40, Vn, is controlled by the PLL, and the source of transistor 40 is coupled to ground. An NMOS transistor 50 has its drain coupled to the common first node of PMOS transistors 10 and 2. The source of NMOS transistor 50 is coupled to ground, and the gate of NMOS transistor 50 is coupled to input Vin. An NMOS transistor 70 has its drain coupled to the common first node of PMOS transistors 10 and 20. The source of NMOS transistor 70 is coupled to ground, and the gate of NMOS transistor 70 is coupled to output Vout. A PMOS transistor 60, has its source coupled to the common second node of NMOS transistors 30 and 40. The drain of PMOS transistor 60 is coupled to VDD, and the gate of PMOS transistor 60 is coupled to input Vin. A PMOS transistor 80 has its source coupled to the common second node of NMOS transistors 30 and 40. The drain of PMOS transistor 80 is coupled to VDD, and the gate of PMOS transistor 80 is coupled to output Vout.

Transistors 50, 60, 70, and 80 are used in DELAY CELL 400 to ensure that transistors 10 and 40 operate in the saturation region only. For example, when Vin=0v and Vout=Vdd, transistors 30 and 50 are off, but transistor 70 is on thus keeping the current Ip through transistor 10 constant. When Vin switches from low to high, transistor 30 is turning on and transistor 60 is turning off. The parasitic capacitance Cout is discharging through transistors 30 and 40 to ground, GND. When Vout is discharged to a low potential, transistor 20 and 60 are turned off and transistor 80 is turned on, ensuring that the current $I_{in}$ through transistor 40 is constant. Thus, the transistors 60 and 80 ensure that the potential across the drain and source of transistor 40 causes transistor 40 to operate in the saturation region. Similarly, transistors 50 and 70 ensure that the potential across transistor 10 causes it to operate in the saturation region. The transistors also track the transition of Vin from high to low to ensure that the transistors 10 and 40 are operating in saturation as Cout is charged through transistor 10. By ensuring the operation of transistors 10 and 40 in the saturation region the supply potential VDD and GND of DELAY CELL 400 suppresses current spikes, thus resulting in output signals with reduced noise.

FIG. 5 illustrates a voltage controlled oscillator (VCO), for use in a PLL, created by the serial connection of three DELAY CELL 400. Inputs Vp and Vn are used by the PLL to control the delay through DELAY CELL 400. Using DELAY CELL 400, this configuration reduces phase jitter through the different stages of VCO 500 by lowering output noise along intermediate nodes NODE A, NODE B, and CLOCK1. Thus, VCO 500 can generate a relatively stable output signal CLOCK by coupling logic elements 505 and 510 to intermediate node CLOCK1. Even in systems with low supply potential and high frequencies, VCO 500 maintains low phase jitter due to the noise suppression of all intermediate nodes by DELAY CELL 400.

FIG. 6 illustrates a PLL generating a clock signal CLK using VCO 500. The PLL generally comprises a PHASE FREQUENCY DETECTOR 610, a CHARGE PUMP 620, a LOOP FILTER 630, and a VCO 500. PLL's are often used in integrated circuits to generate the system clock with reference to a system clock PRECLK.

In response to a voltage at its input, VCO 500 outputs an oscillating signal CLK that is the output of the PLL. The CLK signal is fed back to the phase detector 610, which compares the phase of CLK to the phase of the reference clock PRECLK, PRECLK having a desired lock frequency for the PLL. PHASE FREQUENCY 610 supplies voltage pulses in response to detecting phase differences between CLK and PRECLK. CHARGE PUMP 620 responds to voltage pulses by outputting current pulses that LOOP FILTER 630 averages to a DC voltage at the input of VCO 500. The DC voltages are inputs Vp and Vn used by DELAY CELL 400 (eg., the circuit of FIG. 4) to regulate the delay time through each delay cell by controlling the pull-up or pull-down current through PMOS transistor Vp and NMOS transistor Vn. This feedback system allows the PLL to accurately shadow the reference clock by controlling the delay cells.

The importance of removing phase jitter is seen in FIG. 6 because the output of the VCO is used in a feedback system phase jitter can create an improper reference for PHASE FREQUENCY DETECTOR 610 leading to a CLK which does not follow the PRECLK. The invented circuit allows the PLL to operate in a low voltage system by reducing the phase jitter associated with VCOs operating at low supply potential, a result which has been unachievable in the prior art.

What is claimed is:

1. An inverting circuit comprising a first circuit having a first input, an output, a first intermediate supply node, and a second intermediate supply node, the first circuit for outputting an inverted input signal;

a first transistor having a control gate coupled to a second input, a drain coupled to a first supply potential, and a source coupled to the first intermediate supply node, the second input for controlling a transition delay of the output;

a second transistor having a control gate coupled to a third input, a source coupled to a second supply potential, and a drain coupled to the second intermediate supply node, the third input for controlling the transition delay of the output;

a second circuit coupled between the first input, the output, the first intermediate supply node, and the second supply potential; wherein the second circuit biases the first transistor in a saturation region; and a third circuit coupled between the first input, the output, the second intermediate supply node, and the first supply potential; wherein the third circuit biases the second transistor in the saturation region.

2. The inverting circuit of claim 1, wherein the second circuit comprises:

a first transistor having a control gate coupled to the first input, a source coupled to the second supply potential, and a drain coupled to the first intermediate supply node; and a second transistor having a control gate coupled to the output node, a source coupled to the second supply potential, and a drain coupled to the first intermediate supply node.

3. The inverting circuit of claim 1, wherein the third circuit comprises:

a first transistor having a control gate coupled to the first input, a source coupled to the first supply potential, and a drain coupled to the second intermediate supply node; and a second transistor having a control gate coupled to the output node, a source coupled to the first supply potential, and a drain coupled to the second intermediate supply node.

4. A voltage controlled delay cell for use in a voltage control oscillator, comprising:

an inverting logic circuit having an input and an output, the inverting logic circuit being coupled to a first transistor at first r/Ode and to a second transistor at a second node;

a first feedback circuit coupled between the output, the input, the first node of the inverting logic circuit, and a first supply potential wherein the first feedback circuit ensures that the first transistor operates within a saturation region; and a second feedback circuit coupled between the output, the input the second node of the inverting logic circuit, and a second supply potential wherein the second feedback circuit ensures that the second transistor operates within the saturation region.

5. A circuit for a voltage controlled oscillator of a phase-locked loop comprising:

a first PMOS and a first NMOS transistor configured as a CMOS inverter between first and second nodes, the CMOS inverter having an input and an output;

a second PMOS transistor coupled between a first supply potential and the first node;

a second NMOS transistor coupled between the second node and ground;

third and fourth NMOS transistors coupled in parallel between the first node and ground, the gates of the third and fourth NMOS transistors being coupled to the input and the output, respectively, such that the second PMOS transistor operates in a saturation region; and third and fourth PMOS transistors coupled in parallel between the second node and the first supply potential, the gates of the third and fourth PMOS transistors being coupled to the input and the output, respectively, such that the second NMOS transistor operates in the saturation region.

6. The circuit of claim 5 wherein the gates of the second PMOS and second NMOS transistors are respectively coupled to feedback voltages of the phase-locked loop which control a delay of the circuit.

7. A voltage controlled oscillator with reduced supply noise comprising:

an odd number of voltage controlled delay cells coupled in a series feedback loop, each voltage controlled delay cell having an input and an output with the output of a first voltage controlled delay cell being coupled to the input of a next voltage controlled delay cell, and the output of a last voltage controlled delay cell being coupled to the input of the first voltage controlled delay cell, each voltage controlled delay cell comprising an inverting logic circuit which includes the input and the output of the voltage controlled delay cell, the inverting logic circuit being coupled to a first transistor at a first node and to a second transistor at a second node;

a first feedback circuit coupled between the output, the input, the first node of the inverting logic circuit, and a first supply potential, wherein the first feedback circuit ensures that the first transistor operates within a saturation region; and a second feedback circuit coupled between the output, the input, the second node of the inverting logic circuit, and a second supply potential, wherein the second feedback circuit ensures that the second transistor operates within the saturation region.

* * * * *

UNITED STATES PATENT AND TRADEMARK OFFICE
CERTIFICATE OF CORRECTION

| | | |
|---|---|---|
| PATENT NO. | : | 5,621,360 |
| DATED | : | April 15, 1997 |
| INVENTOR(S) | : | Samson X. Huang |

It is certified that error appears in the above-identified patent and that said Letters Patent is hereby corrected as shown below:

In column 5 at line 8 delete "drain" and insert --source--

In column 5 at line 9 delete "source" and insert --drain--

In column 5 at line 51 delete "at first r/Ode" and insert --at a first node--

Signed and Sealed this

Second Day of September, 1997

BRUCE LEHMAN

*Attest:*

*Attesting Officer*    Commissioner of Patents and Trademarks